(12) United States Patent
Kameyama et al.

(10) Patent No.: US 8,278,213 B2
(45) Date of Patent: Oct. 2, 2012

(54) SEMICONDUCTOR DEVICE AND MANUFACTURING METHOD OF THE SAME

(75) Inventors: Koujiro Kameyama, Ota (JP); Akira Suzuki, Ota (JP); Yoshio Okayama, Brookline, MA (US)

(73) Assignee: SANYO Electric Co., Ltd., Moriguchi-shi (JP)

( * ) Notice: Subject to any disclaimer, the term of this patent is extended or adjusted under 35 U.S.C. 154(b) by 644 days.

(21) Appl. No.: 11/054,616

(22) Filed: Feb. 10, 2005

(65) Prior Publication Data
US 2005/0194670 A1 Sep. 8, 2005

(30) Foreign Application Priority Data

Feb. 17, 2004 (JP) ................... 2004-040408

(51) Int. Cl.
*H01L 21/44* (2006.01)
*H01L 23/48* (2006.01)
(52) U.S. Cl. ........... 438/667; 257/758; 257/E21.597; 257/E23.021; 438/113
(58) Field of Classification Search .......... 257/774, 257/758, 737, 780, E21.597, E23.011, E23.021; 438/113, 667
See application file for complete search history.

(56) References Cited

U.S. PATENT DOCUMENTS

| | | | |
|---|---|---|---|
| 5,434,094 A * | 7/1995 | Kobiki et al. | 438/167 |
| 5,767,001 A | 6/1998 | Bertagnolli et al. | |
| 5,814,889 A * | 9/1998 | Gaul | 257/773 |
| 5,851,928 A | 12/1998 | Cripe et al. | |
| 6,235,552 B1 | 5/2001 | Kwon et al. | |
| 6,379,982 B1 * | 4/2002 | Ahn et al. | 438/14 |
| 6,406,934 B1 | 6/2002 | Glenn et al. | |
| 6,590,257 B2 * | 7/2003 | Ohuchi | 257/347 |
| 6,630,725 B1 * | 10/2003 | Kuo et al. | 257/659 |
| 6,699,787 B2 | 3/2004 | Mashino et al. | |
| 6,703,689 B2 | 3/2004 | Wada | |
| 6,864,172 B2 | 3/2005 | Noma et al. | |
| 6,911,392 B2 | 6/2005 | Bieck et al. | |
| 2002/0047210 A1 * | 4/2002 | Yamada et al. | 257/774 |
| 2003/0230805 A1 * | 12/2003 | Noma et al. | 257/737 |
| 2004/0137701 A1 | 7/2004 | Takao | |
| 2005/0003649 A1 | 1/2005 | Takao | |

FOREIGN PATENT DOCUMENTS

CN 1445829 10/2003

(Continued)

OTHER PUBLICATIONS

Campbell, Stephen A.; The Science and Engineering of Microelectronic Fabrication; Second Edition, 2001; Oxford University Press; New York, New York; pp. 258-264 and 305-306.*

(Continued)

*Primary Examiner* — Colleen Matthews
(74) *Attorney, Agent, or Firm* — Morrison & Foerster LLP (57) ABSTRACT

This invention improves reliability of a semiconductor device and a manufacturing method thereof. A glass substrate is bonded on a surface of a silicon wafer formed with pad electrodes. Next, via holes are formed from a back surface of the silicon wafer to pad electrodes, and a groove is formed extending along a center line of a dicing line and penetrating the silicon wafer from its back surface. After then, in processes including heating treatment, cushioning pads, wirings, a solder mask, and solder balls are formed on the back surface of the silicon wafer. Finally, the silicon wafer bolstered by the glass substrate is separated into individual silicon dice by dicing.

9 Claims, 9 Drawing Sheets

FOREIGN PATENT DOCUMENTS

| | | |
|---|---|---|
| CN | 1469447 | 1/2004 |
| EP | 0703618 | 3/1996 |
| EP | 1 376 678 A2 * | 1/2004 |
| JP | 9-181043 | 7/1997 |
| JP | 2001-176898 | 6/2001 |
| JP | 2002-025948 A | 1/2002 |
| JP | 2002-94082 | 3/2002 |
| JP | 2002-100709 | 4/2002 |
| JP | 2002-373957 A | 12/2002 |
| JP | 2005-512436 T | 4/2005 |
| JP | 2005-294875 | 10/2005 |
| WO | 99/40624 | 8/1999 |
| WO | WO-03/019653 A2 | 3/2003 |

OTHER PUBLICATIONS

European Search Report mailed on Aug. 28, 2008 directed at foreign application EP-05003397.6; 3 pages.

* cited by examiner

SEMICONDUCTOR DEVICE AND MANUFACTURING METHOD OF THE SAME

CROSS-REFERENCE OF THE INVENTION

This invention is based on Japanese Patent Application No. 2004-40408, the content of which is incorporated by reference in its entirety.

BACKGROUND OF THE INVENTION

1. Field of the Invention

This invention relates to a semiconductor device of a chip size package type and a manufacturing method thereof.

2. Description of the Related Art

CSP (Chip Size Package) has received attention in recent years as a three-dimensional mounting technology as well as a new packaging technology. The CSP means a small package having almost the same outside dimensions as those of a semiconductor die packaged in it.

Conventionally, BGA (ball grip array) type semiconductor devices have been known as a kind of CSP. In this BGA type semiconductor device, a plurality of ball-shaped conductive terminals made of metal such as solder is arrayed in a grid pattern on one surface of the package, and electrically connected with the semiconductor die mounted on the other side of the package.

When this BGA type semiconductor device is mounted on electronic equipment, the semiconductor die is electrically connected with an external circuit on a printed circuit board by compression bonding of the ball-shaped conductive terminals to wiring patterns on the printed circuit board.

Such a BGA type semiconductor device has advantages in providing a large number of conductive terminals and in reducing size over other CSP type semiconductor devices such as SOP (Small Outline Package) and QFP (Quad Flat Package), which have lead pins protruding from their sides. The BGA type semiconductor device is used as an image sensor chip for a digital camera incorporated into a mobile telephone, for example.

Figure 13A:
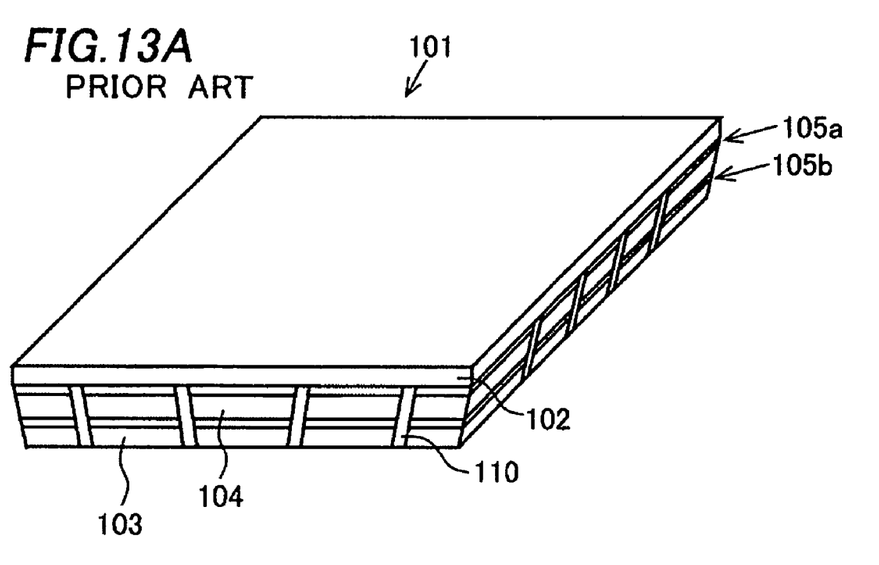
FIG. 13 is a view showing a semiconductor device of a conventional art.
Figure 13B:
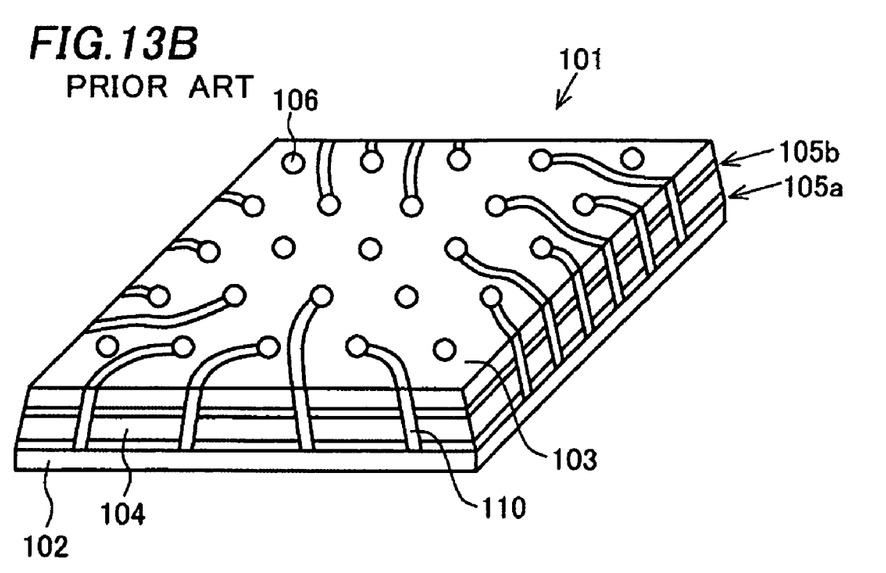

FIGS. 13A and 13B show an outline structure of the conventional BGA type semiconductor device. FIG. 13A is an oblique perspective figure showing a top side of the BGA type semiconductor device. FIG. 13B is an oblique perspective figure showing a back side of the BGA type semiconductor device.

A semiconductor die 104 is sealed between a first glass substrate 102 and a second glass substrate 103 through epoxy resin layers 105a and 105b in the BGA type semiconductor device 101. A plurality of conductive terminals 106 is arrayed in a grid pattern on a surface of the second glass substrate 103, that is, on the back surface of the BGA type semiconductor device 101. The conductive terminals 106 are connected to the semiconductor die 104 through a plurality of second wirings 110. The plurality of second wirings 110 is connected with aluminum wirings pulled out from inside of the semiconductor die 104, making each of the conductive terminals 106 electrically connected with the semiconductor die 104.

Figure 14:
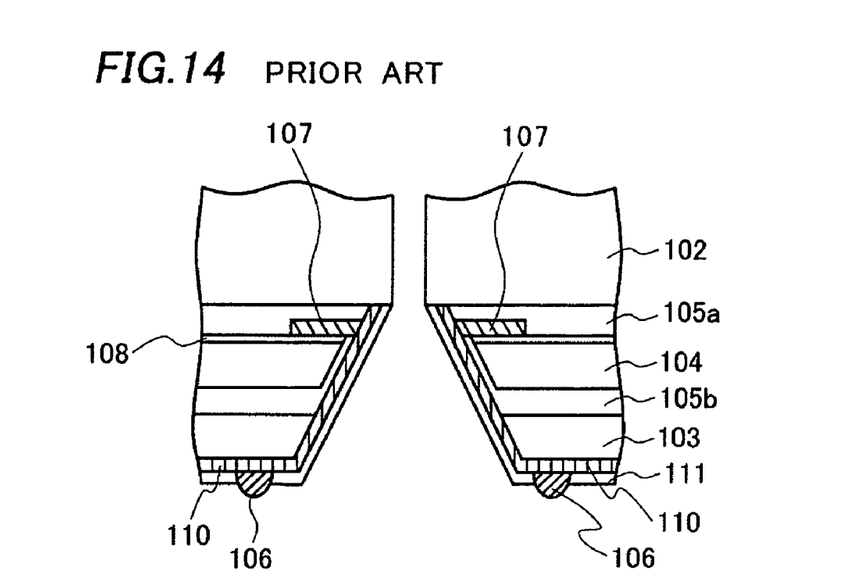
FIG. 14 is a cross-sectional view showing the semiconductor device of the conventional art.

More detailed explanation on a cross-sectional structure of the BGA type semiconductor device 101 will be given hereafter referring to FIG. 14. FIG. 14 shows a cross-sectional view of the BGA type semiconductor devices 101 separated into individual dice along dicing lines.

A first wiring 107 is provided on an insulation film 108 on the top surface of the semiconductor die 104. The semiconductor die 104 is bonded to the first glass substrate 102 with the resin layer 105a. A back surface of the semiconductor die 104 is bonded to the second glass substrate 103 with the resin layer 105b.

One end of the first wiring 107 is connected to the second wiring 110. The second wiring 110 extends from the end of the first wiring 107 onto a surface of the second glass substrate 103. The ball-shaped conductive terminal 106 is formed on the second wiring 110 extended onto the second glass substrate 103.

The technology mentioned above is disclosed, for example, in the Japanese Patent Application Publication No. 2002-512436.

However, there is a possibility that the first wiring 107 and the second wiring 110 are disconnected at a point of contact between them, since the area of the point of contact is very small in the BGA type semiconductor device 101 described above. Also there is a problem in step coverage of the second wiring 110.

Furthermore, the glass substrates 102 and 103 are bonded on the semiconductor die 104 through an epoxy resin in the semiconductor device described above. Since the members having different thermal expansion coefficients are thus bonded together, warping of the semiconductor wafer occurs in processes including heating treatment, thereby causing a problem of degrading work efficiency.

SUMMARY OF THE INVENTION

The invention provides a method of manufacturing a semiconductor substrate. The method includes providing a semiconductor substrate comprising a pad electrode formed on a top surface thereof, bonding a supporting member to the top surface of the semiconductor substrate, forming a via hole penetrating the semiconductor substrate from a back surface thereof to expose a surface of the pad electrode, forming a groove penetrating the semiconductor substrate from the back surface of the semiconductor substrate, forming an insulation film over the back surface of the semiconductor substrate so that the insulation film covers inside walls of the via hole and the groove, etching the insulation film to remove portions of the insulation film at a bottom of the via hole and at the top surface of the semiconductor substrate so that inside-wall insulation films are formed on the inside walls of the via hole and the groove, forming a wiring layer that is disposed on the back surface of the semiconductor substrate and connected with the pad electrode through the via hole.

The invention also provides a semiconductor device that includes a semiconductor die having a via hole, a pad electrode disposed on a top surface of the semiconductor die so as to cover the via hole, a supporting member bonded to the top surface of the semiconductor die, a first insulation film disposed on a sidewall of the via hole, a second insulation film disposed on an outside sidewall of the semiconductor die, and a wiring layer disposed on a back surface of the semiconductor die and connected with the pad electrode through the via hole.

DETAILED DESCRIPTION OF THE INVENTION

Figure 11:
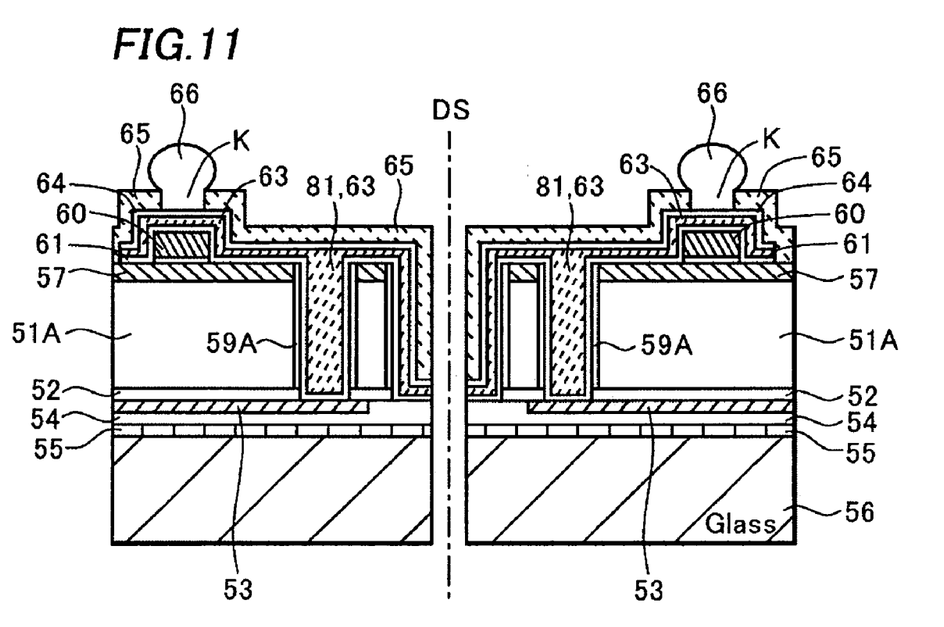
FIG. 11 is a cross-sectional view showing the semiconductor device and the manufacturing method thereof of the embodiment of the invention.

An embodiment of this invention will be described in detail, referring to figures hereinafter. First, a structure of the semiconductor device will be described. FIG. 11 is a cross-sectional view of the semiconductor device separated into individual dice by dicing a silicon wafer 51 along a center DS of a dicing line in a dicing line region DL after process steps to be described hereinafter.

A silicon die 51A as a semiconductor die is a CCD (Charge Coupled Device) image sensor chip, for example. A pad electrode 53 is formed on a top surface of the silicon die 51A through an interlayer insulation film 52, or a first insulation film, such as a BPSG (Boro-Phospho Silicate Glass) film. The pad electrode 53 is formed by extending a normal pad electrode used for wire bonding to the dicing line region DL (see FIG. 1) in and is also called an extended pad electrode.

The pad electrode 53 is covered with a passivation film 54 made of a silicon nitride film, for example. A glass substrate 56 is bonded through a resin layer 55 made of an epoxy resin, for example, to the surface of the silicon die 51A, on which the pad electrode 53 is formed. The glass substrate 56 is used as a protection substrate to protect the silicon die 51A as well as a supporting substrate to bolster the silicon die 51A. This glass substrate 56 may be replaced with a protecting tape and attached to the silicon dice 51A. In addition, a double-sided adhesive tape may be also used to as a support.

When the silicon die 51A is the CCD image sensor chip, using a transparent substrate such as the glass substrate 56 or a semitransparent substrate is required because light from outside needs to be received with the CCDs on the surface of the silicon die 51A. An opaque substrate may be used when the silicon die 51A is not a light-receiving or a light-emitting chip.

A via hole 81 is formed in the silicon die 51A from a back surface of the silicon die 51A and to reach the pad electrode 53. A sidewall insulation film 59A, or an inside-wall insulation film, is formed on a sidewall of the via hole 81 and a sidewall of the silicon die 51A. This sidewall is also called "an outside sidewall including an etched surface of the semiconductor die," as it is formed by etching as explained below. The outside sidewall is normal to the front surface of the semiconductor die. The sidewall insulation film 59A electrically isolates the silicon die 51A from a wiring 63 which will be described below.

A cushioning pad 60 is formed on the back surface of the silicon die 51A in a region adjacent to the via hole 81 through a first insulation film 57.

A wiring 63, or a metal layer, electrically connected to the pad electrode 53 through the via hole 81 is formed to extend from the via hole 81 and to run over the back surface and the sidewall of the silicon die 51A. A layer of the wiring 63 is also called a re-distribution layer, and has a structure of a layer of barrier metal such as Ni/Au stacked on a layer of copper (Cu), for example. This metal layer covers the outside sidewall of the silicon die 51A, as shown in FIG. 11.

A seed layer 61 is provided under the wiring 63. The seed layer 61 is a metal layer serving as a plating electrode in forming the wiring 63 by electrolytic plating. The wiring 63 extends over the back surface of the silicon die 51A to cover the cushioning pad 60.

The wiring 63 is covered with a solder mask 65 which makes a protection film. An opening K is formed in the solder mask 65 above the cushioning pad 60. A solder ball 66 which makes the conductive terminal is mounted through the opening K in the solder mask 65. The solder ball 66 is hereby electrically connected with the wiring 63. A BGA structure is obtained by forming a plurality of such solder balls 66.

Thus, the connection between the pad electrode 53 on the silicon die 51A and the solder ball 66 formed on its back surface can be formed as described above. Since the connection is made through the via hole 81, disconnection occurs hardly and step coverage is excellent. In addition, mechanical strength of the connection is high.

Furthermore, moisture infiltration into the silicon die 51A can be minimized since the wiring 63 and the solder mask 65 cover the sides of the silicon die 51A.

Also, damage to the solder balls 66 and the semiconductor device itself is prevented, since the solder ball 66 is disposed on the cushioning pad 60 which serves as a kind of cushion when the semiconductor device is mounted on a printed circuit board through the solder ball 66.

Furthermore, the solder ball 66 is formed at a location elevated by a thickness of the cushioning pad 60 above the back surface of the silicon die 51A. Because of that, the solder ball 66 and the silicon die 51A are better protected from potential damage caused by stress due to difference in coefficients of thermal expansion between the printed circuit board and the solder ball 66, when the semiconductor device is mounted on the printed circuit board.

The cushioning pad 60 may be made of a material chosen from various materials such as an organic insulator, inorganic insulator, metal, silicon and photoresist. Materials having high flexibility such as the organic insulator, the inorganic insulator and the photoresist are better suited to serve as a cushion.

The silicon die 51A may be replaced with a die made of other semiconductor material such as GaAs, Ge or Si—Ge.

Figure 1:
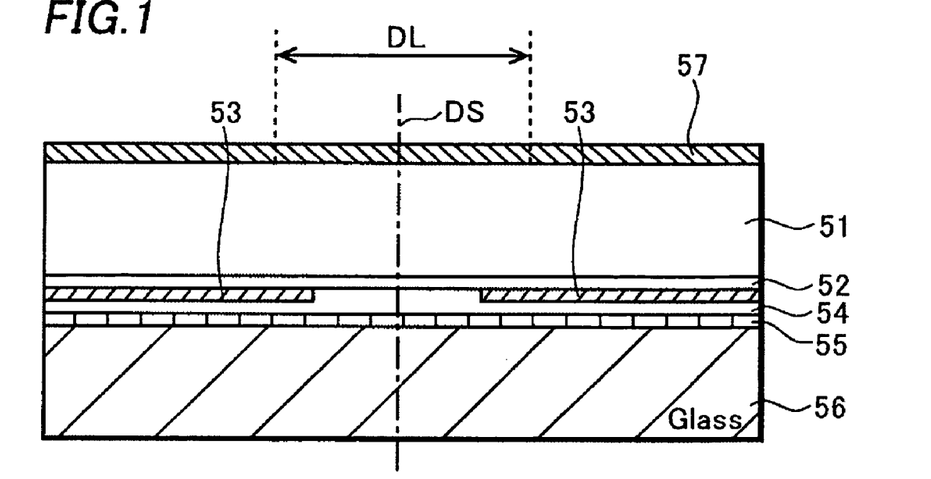
FIG. 1 is a cross-sectional view showing a manufacturing method of a semiconductor device of an embodiment of the invention.

Next, a manufacturing method of the semiconductor device will be described hereinafter. It is assumed that a semiconductor integrated circuit (a CCD image sensor, for example, not shown) is formed on the top surface of a silicon wafer 51 as a semiconductor substrate, as shown in FIG. 1. FIG. 1 shows a cross-section of neighboring dice around a border along which the dice are to be separated in a dicing process to be described below.

A pair of pad electrodes 53 is formed on a surface of the silicon wafer 51 through the interlayer insulation film 52 such as a BPSG (Boro-Phospho Silicate Glass) film. The pair of pad electrodes 53 is made of a layer of metal such as aluminum, an aluminum alloy or copper, and is about 1 μm thick. The pair of pad electrodes 53 is extended into a dicing line region DL with their extended ends disposed close to the center line DS of the dicing line.

The passivation film 54 made of a silicon nitride film, for example, is formed to cover the pair of pad electrodes 53 and a resin layer 55 made of an epoxy resin, for example, is applied to the passivation film 54.

Then the glass substrate 56 is bonded to the surface of the silicon wafer 51 through the resin layer 55. The glass substrate 56 works as a substrate to protect and bolster the silicon wafer 51. It is noted that the substrate to bolster the silicon wafer 51 is not necessarily the glass substrate 56 and a substrate-like member or a tape-like member made of a metal or an organic material. After the glass substrate 56 is bonded, thickness of the silicon wafer 51 is reduced to about 150 μm by back surface etching or so-called back-grinding when needed.

Then a top portion of the back surface of the silicon wafer 51 is etched off by about 20 μm using an acid (a mixed solution of hydrogen fluoride and nitric acid, for example) as an etchant. The etching removes a mechanically damaged layer of silicon wafer 51 caused by the back-grinding and is effective to improve characteristics of a device formed in the surface of the silicon wafer 51. Although the finished thickness of the silicon wafer 51 is about 130 μm in this embodiment, it may be chosen depending on kinds of devices formed on the silicon wafer 51.

The first insulation film 57 is formed on the entire back surface of the silicon wafer 51, the top portion of which has been removed in the process step described above. The first insulation film 57 is formed by plasma CVD (Chemical Vapor Deposition), for example, and a PE-SiO$_2$ film and a PE-SiN film are suitable for it. It is noted that the formation of the first insulation film 57 can be omitted.

Figure 2:
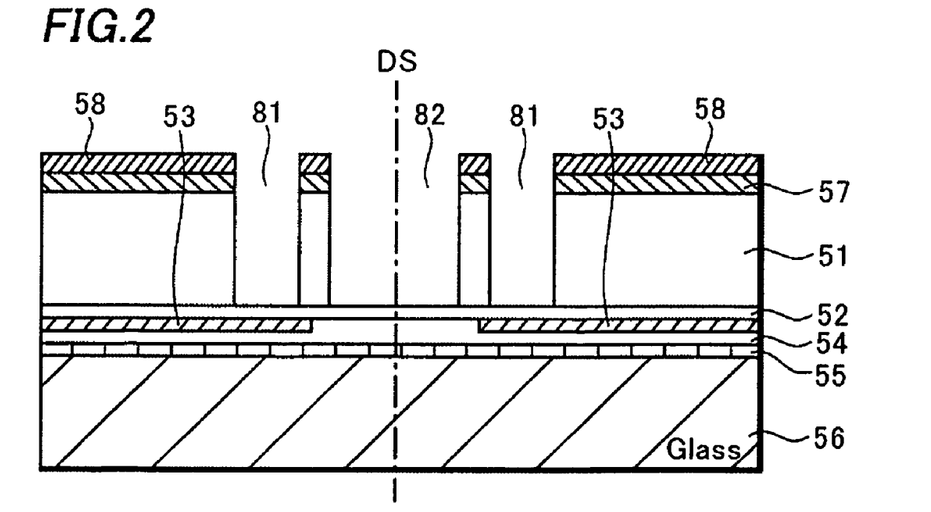
FIG. 2 is a cross-sectional view showing the manufacturing method of the semiconductor device of the embodiment of the invention.

Next, a photoresist layer 58 is formed selectively on the first insulation film 57, as shown in FIG. 2. The first insulation film 57 and the silicon wafer 51 are etched by using this photoresist layer 58 as a mask. By this etching, the via holes 81 penetrating the silicon wafer 51, and a groove 82 extending along the center line DS of the dicing line in the dicing line region DL and penetrating the silicon wafer 51 are formed. It is noted that a forming process of the first insulation film 57 can be omitted. In this case, the photoresist layer 58 formed directly on the silicon wafer 51 is used as a mask to etch the silicon wafer 51.

Wet-etching or dry-etching can be used for forming the via hole 81 and the groove 82. This embodiment employs dry-etching using etching gas including $SF_6$, $O_2$ or fluorocarbon such as $C_2F_4$, $C_4F_8$, $CHF_3$ or a combination thereof. The via hole 81 can be formed to have tapered cross-sectional shape in order to improve coverage of the seed layer 61 described below. Accordingly, the via hole 81 and the groove 82 formed along the dicing line have etched surfaces.

The interlayer insulation film 52 is exposed at the bottom of the via hole 81, being in contact with the pad electrode 53. The width and length of the via hole 81 are about 40 μm and 200 μm, respectively. The interlayer insulation film 52 is also exposed at the bottom of the groove 82. The depth of the groove 82 is the same (or nearly the same) as that of the via hole 81. That is, the silicon wafer 51 is separated into individual silicon dice by the groove 82, while still being bonded to the glass substrate 56. With this structure, in the heating treatment (e.g. heating treatment in a sputtering process or heating treatment when reflowing solder) in the processes described below, since the silicon wafer 51 is separated into pieces on the glass substrate 56, expansion or shrinkage of the silicon wafer 51 corresponding to its thermal expansion coefficient as seen in the conventional art is halted and reduced. Therefore, only expansion or shrinkage corresponding to the thermal expansion coefficient of the glass substrate 56 is to be considered in the heating treatment, so that warping is minimized compared with the conventional art. Furthermore, reliability can be increased by further considering the expansion and shrinkage of the epoxy resin corresponding to the thermal expansion coefficient used as the adhesive.

Figure 12:
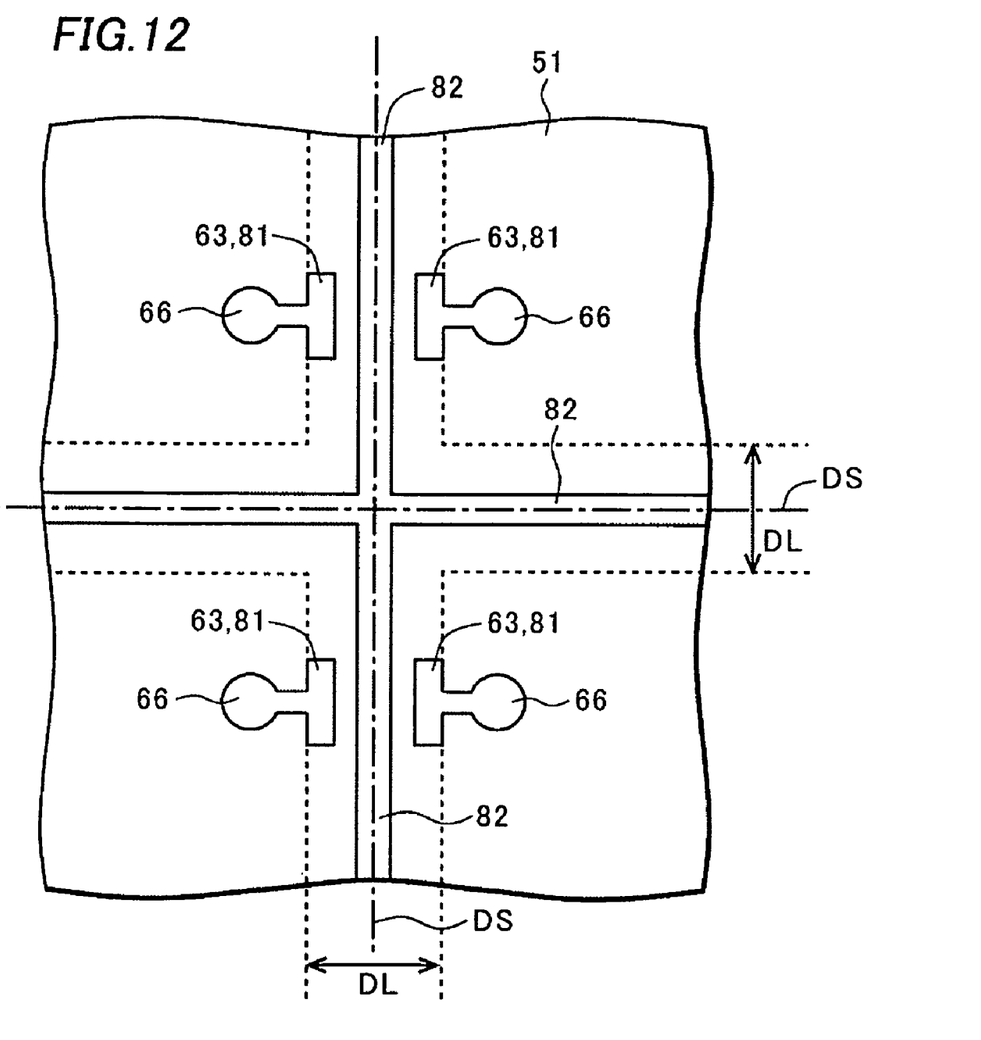
FIG. 12 is a plan view showing the manufacturing method of the semiconductor device of the embodiment of the invention.

The positional relationship of the via hole 81, the groove 82, and the dicing line region DL formed on the silicon wafer 51 is shown in a plan view of FIG. 12, which is a view seen from the back side of the silicon wafer 51. The pad electrode 53 is not necessarily formed along the dicing line.

Figure 3:
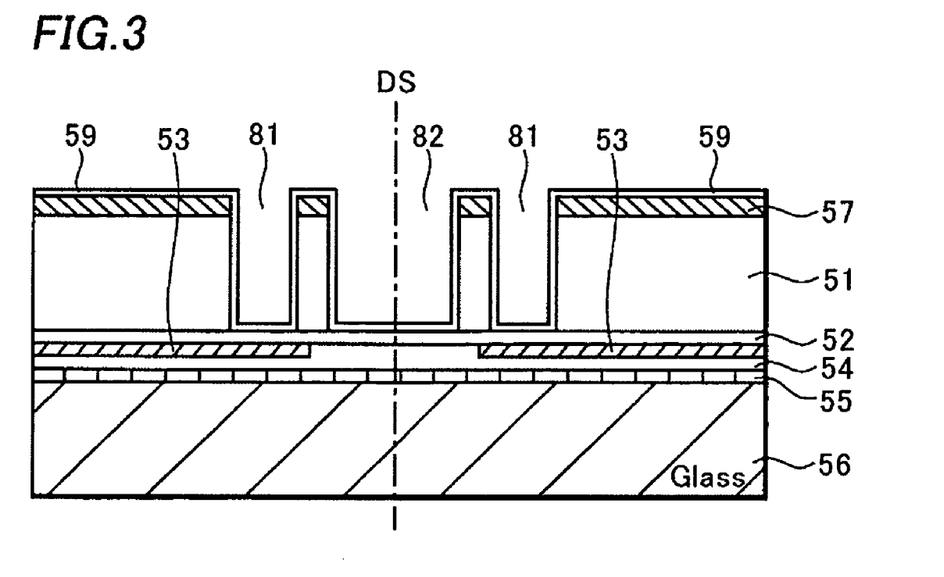
FIG. 3 is a cross-sectional view showing the manufacturing method of the semiconductor device of the embodiment of the invention.

Next, a second insulation film 59 is formed on the entire back surface of the silicon wafer 51 in which the via holes 81 and the groove 82 are formed, as shown in FIG. 3. The second insulation film 59 is formed by plasma CVD (Chemical Vapor Deposition) method, for example, and a PE-SiO$_2$ film and a PE-SiN film are suitable for it. The second insulation film 59 is formed on the bottom and the sidewall of each of the via holes 81, on the bottom and the sidewall of the groove 82, and on the first insulation film 57.

Figure 4:
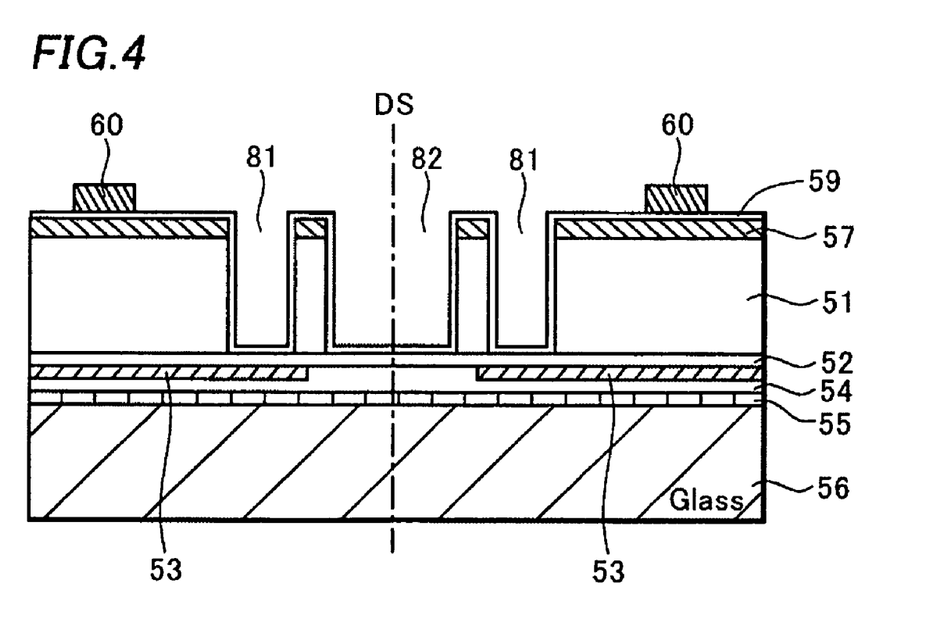
FIG. 4 is a cross-sectional view showing the manufacturing method of the semiconductor device of the embodiment of the invention.

Next, the cushioning pads 60 are formed on the second insulation film 59 at locations adjacent to the via holes 81, as shown in FIG. 4. The cushioning pads 60 can be formed in pre-determined regions using a resist film and by exposure with a mask and development. However, the cushioning pad 60 may be formed of a material chosen from various materials such as an organic insulator, inorganic insulator, metal, silicon and photoresist. Materials having high flexibility such as the organic insulator, the inorganic insulator and the photoresist are better suited to serve as a cushion. The cushioning pad 60 can be omitted.

Figure 5:
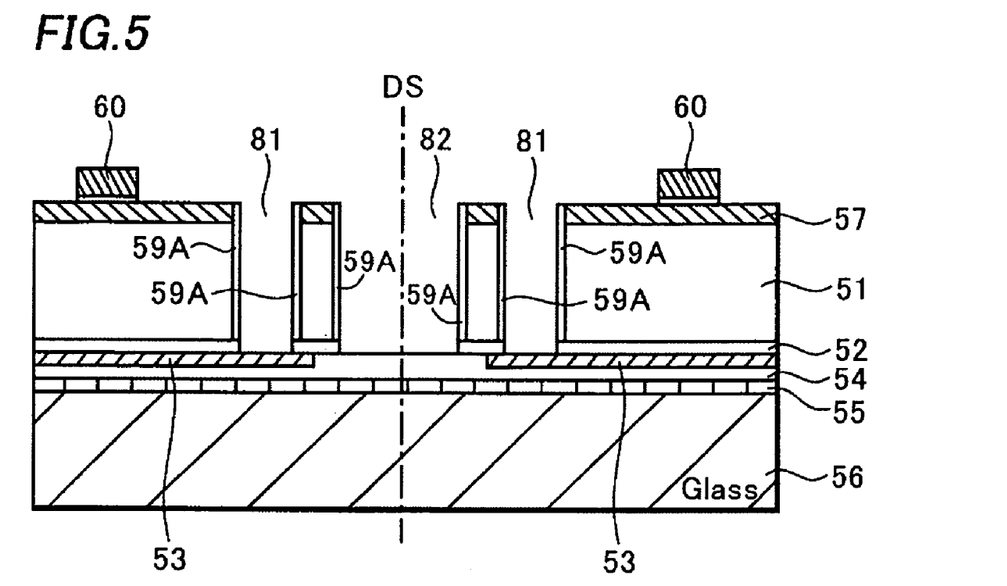
FIG. 5 is a cross-sectional view showing the manufacturing method of the semiconductor device of the embodiment of the invention.

Next, anisotropic dry etching is performed without using a photoresist layer, as shown in FIG. 5. The second insulation film 59 remains only on the sidewall of each of the via holes 81 and on the sidewall of the groove 82, making the sidewall insulation film 59A. The second insulation film 59 and the interlayer insulation film 52 at the bottom of the via holes 81 and the groove 82 are etched off in this etching process to expose the pad electrodes 53 at the bottom of the via hole 81.

The second insulation film 59 is formed in the via holes 81 after the via holes 81 are formed and the second insulation film 59 and the interlayer insulation film 52 at the bottom of each of the via holes 81 are removed by etching to expose the pad electrodes 53 after the cushioning pads 60 are formed, in this embodiment as described above.

On the contrary, it is also possible that the cushioning pads 60 are formed after the bottom of each of the via holes 81 are etched to expose the pad electrodes 53. In this case, however, there is a possibility that the bottom of each of the via holes 81 might be contaminated when the cushioning pads 60 are formed, resulting in a failure in an electrical connection between the pad electrode 53 and the wiring 63 which will be formed later in the via hole 81. Therefore it is preferable for the sake of better electrical connection between the wiring 63 and the pad electrode 53 that the bottom of each of the via holes 81 is etched after the cushioning pads 60 are formed, as in the embodiment.

The sidewall insulation film 59A is formed by etching the insulation film in the via hole 81 after forming the cushioning pad 60, in the process step shown in FIG. 5. The etching makes a surface of the cushioning pad 60 rough, benefiting it from increased adhesiveness to the seed layer 61 which will be described below.

Figure 6:
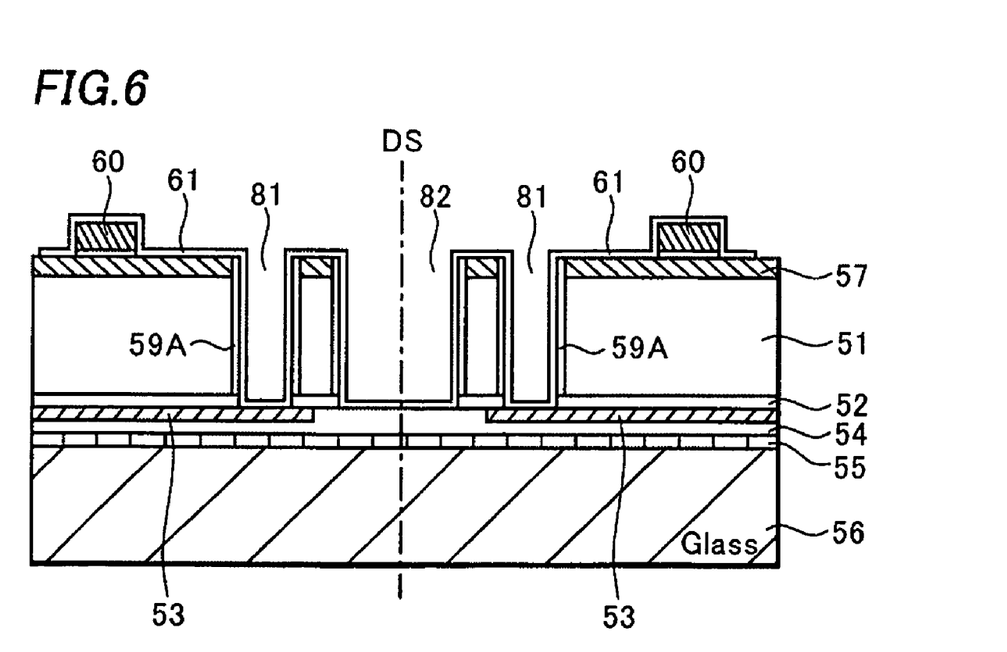
FIG. 6 is a cross-sectional view showing the manufacturing method of the semiconductor device of the embodiment of the invention.

Next, a process to form the wiring 63 is described. The seed layer 61 made of a layer of copper (Cu), a layer of barrier metal such as titanium tungsten (TiW), titanium nitride (TiN) or tantalum nitride (TaN) or stacked layers of copper (Cu) and barrier metal is formed on the entire back surface of the silicon wafer 51 including inside surfaces of the via holes 81 and the groove 82 by sputtering, MOCVD (Metal-Organic Chemical Vapor Deposition) or electroless plating including heating treatment, as shown in FIG. 6. The seed layer 61 is formed to be connected to the pad electrodes 53 and to cover the sidewall insulation films 59A in the via holes 81.

The seed layer 61 also covers the cushioning pads 60. The layer of barrier metal forming the seed layer 61 prevents copper (Cu) from diffusing into the silicon wafer 51 through the sidewall insulation film 59A. The seed layer 61 made of copper (Cu) only causes no problem when the sidewall insulation film 59A is formed of a SiN film, since the SiN film serves as a barrier against the diffusion of copper.

The seed layer 61 serves as a plating electrode for growth of plating during electrolytic plating, which will be described below. Thickness of about 1 μm is enough for it. The seed layer 61 may be formed by sputtering when the via holes 81 are formed in the tapered down shape.

Figure 7:
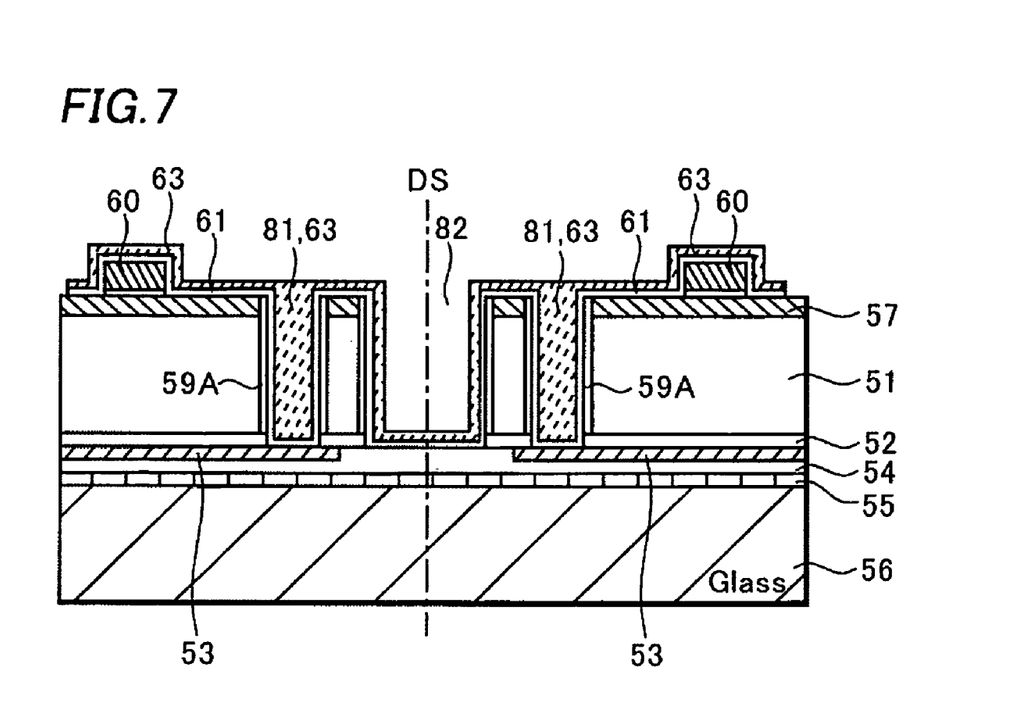
FIG. 7 is a cross-sectional view showing the manufacturing method of the semiconductor device of the embodiment of the invention.

Next, the wirings 63 are formed by electrolytic plating of copper (Cu), as shown in FIG. 7. The wirings 63 are drawn out from the via holes 81 and extend over the back surface of the silicon wafer 51 to cover the cushioning pads 60. With this, the wirings 63 are electrically connected with the pad electrodes 53. The wirings 63 extend from the back surface of the silicon wafer 51 to the inside of the groove 82 to cover the sidewall and bottoms of the groove 82.

Although the wirings 63 fill the via holes 81 completely in FIG. 7, the wirings 63 may be formed to fill the via holes 81 incompletely by adjusting plating time. Although electrolytic plating is used to form the wirings 63 filling the via hole 81, other methods may be used. For example, the wirings 63 can be formed by filling metal such as copper (Cu) or aluminum (Al) in the via hole 81 by the CVD method or the MOCVD method. Furthermore, a required number of the wirings 63 can be formed in a required region of the back surface of the silicon wafer 51.

Since the wirings 63 extending from the pad electrode 53 to the solder ball 66 of the silicon die 51A are formed through the via hole 81, disconnection of the wirings 63 and deterioration of the step coverage can be minimized, compared with the conventional art. This can provide the BGA type semiconductor device having higher reliability than the conventional art.

Figure 8:
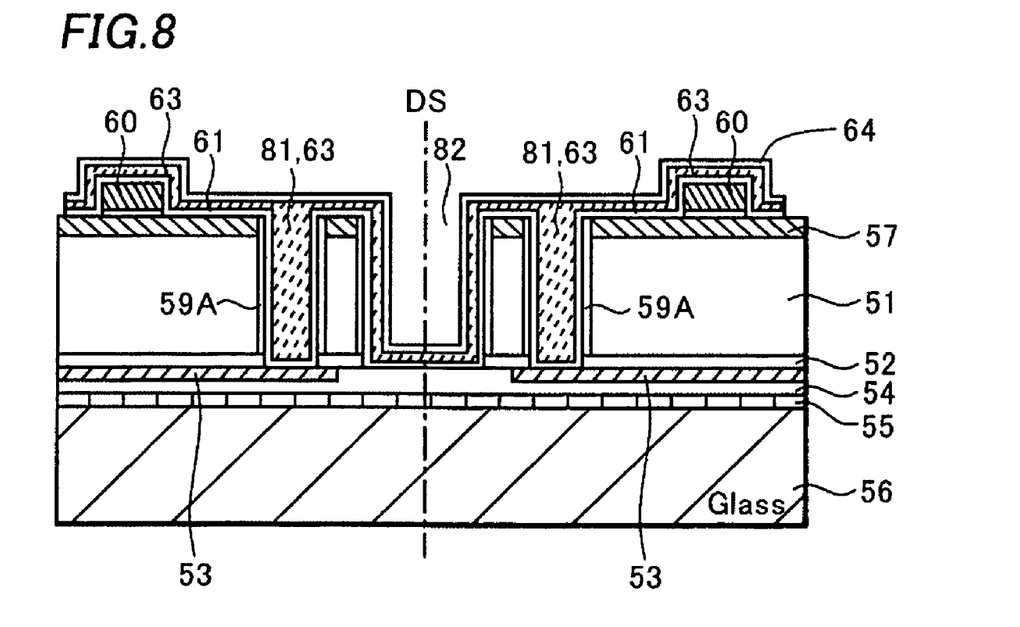
FIG. 8 is a cross-sectional view showing the manufacturing method of the semiconductor device of the embodiment of the invention.
Figure 9:
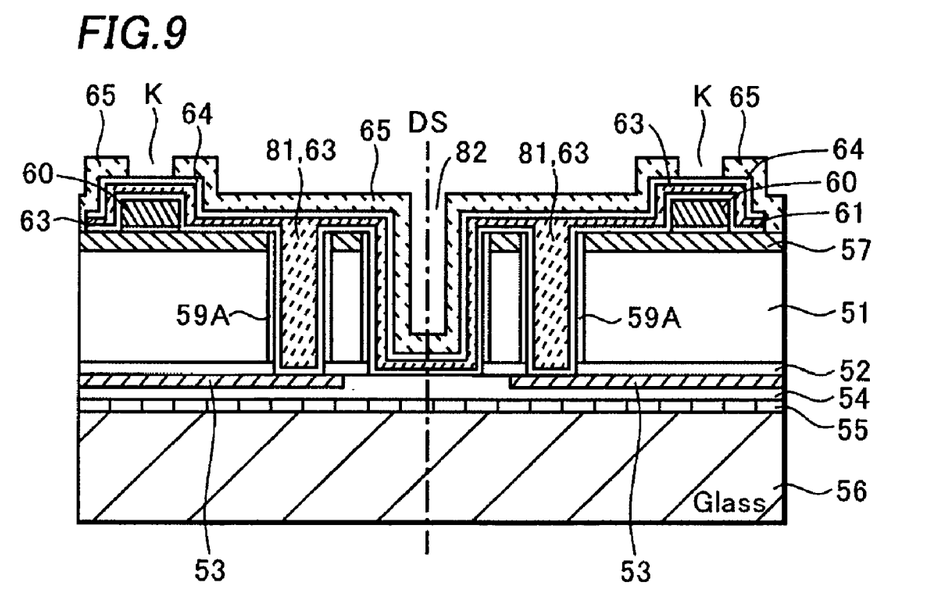
FIG. 9 is a cross-sectional view showing the manufacturing method of the semiconductor device of the embodiment of the invention.

Then the barrier layer 64 made of Ni/Au layer is formed on the wirings 63 by electroless plating or by sputtering of nickel (Ni) and gold (Au), as shown in FIG. 8. Next, the wiring layer 63 is covered with the solder mask 65 serving as the protection layer, as shown in FIG. 9. The solder mask 65 is removed from regions above the cushioning pads 60 to provide the openings K.

Figure 10:
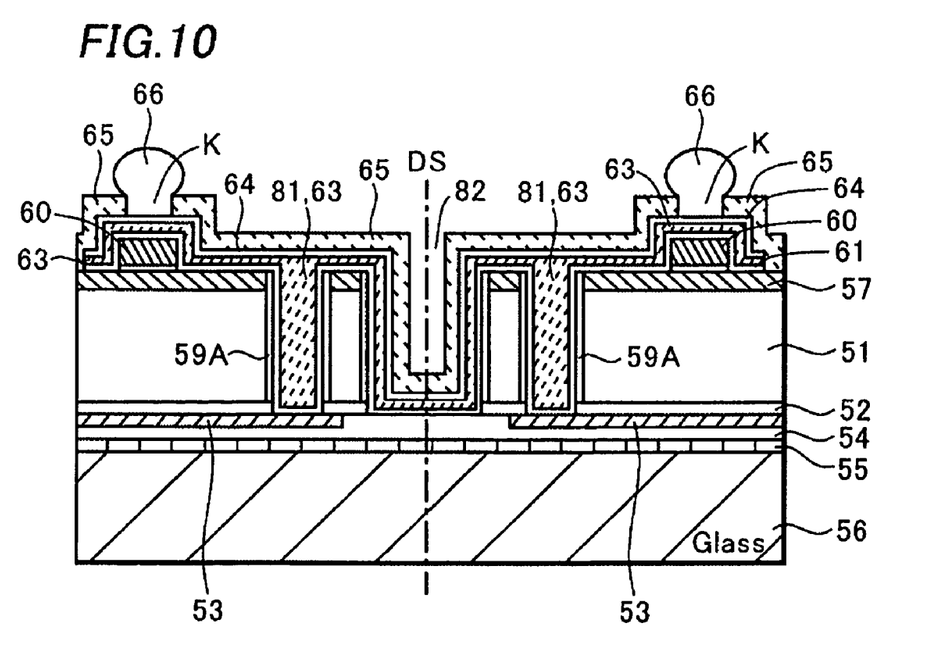
FIG. 10 is a cross-sectional view showing the manufacturing method of the semiconductor device of the embodiment of the invention.

Solder is printed on predetermined regions on the wirings 63 using screen printing, and the solder is reflowed by heating treatment to form the solder balls 66, as shown in FIG. 10. The solder balls 66 are not limited to the solder and may be formed using a metal or an alloy free of lead and with a low melting point. The number and locations of the solder balls 66 can be chosen at will. The solder ball 66 can be formed not only by solder reflowing but also by plating.

Furthermore, the solder ball 66 is formed at a location elevated by a thickness of the cushioning pad 60 above the back surface of the silicon die 51A. Because of that, the solder ball 66 is better protected from potential damage caused by stress generated when the semiconductor device is mounted on the printed circuit board. Furthermore, the solder ball 66 is formed on the cushioning pad 60, so that a shock occurred when the semiconductor device is mounted on the printed circuit board decreases to prevent the semiconductor device from being damaged.

The silicon wafer 51 is separated into a plurality of silicon dice 51A by dicing along the dicing line center DS in the dicing line region DL, as shown in FIG. 11. A dicing blade is used in this dicing process.

The groove 82 works as the sidewall of the silicon die 51A. This sidewall of the silicon die 51A is covered with the sidewall insulation film 59A, the seed layer 61, the wiring layer 63, the barrier layer 64, and the solder mask 65. This minimizes moisture infiltration in the silicon die 51.

In the heating treatment in the processes described above, that is, when the seed layer 61 and so on are formed by sputtering or the solder balls 66 are formed by solder reflowing, since the silicon wafer 51 is bolstered by the glass substrate 56, being separated by the groove 82 (FIG. 12), warping caused by a difference in thermal expansion coefficient between the glass substrate 56 and the silicon wafer 51 is reduced. This enables smooth carriage of the silicon wafer 51 when shifting to different processes and can improve the yield of the semiconductor device.

Furthermore, this embodiment is not limited to the pad electrode 53 formed by extending a normal pad electrode used for wire bonding to the dicing line region DL as described above in the embodiment. The normal pad electrode used for wire bonding not extended to the dicing line region DL may be used instead of the pad electrode 53. In this case, only a location to form the via hole 81 is required to be adjusted to a location of the normal pad, leaving other manufacturing process steps unchanged.

The embodiment is applied to the BGA type semiconductor device formed with the solder balls 66 and the manufacturing method thereof. However, the invention is also applicable to the semiconductor device formed with no solder balls and the manufacturing method thereof when the invention includes the heating treatment after the process for forming the via holes penetrating the silicon wafer, for example, to an LGA (Land Grid Array) type semiconductor device and a manufacturing method thereof.

What is claimed is:

1. A method of manufacturing a semiconductor device, comprising:
    providing a semiconductor substrate comprising a first insulation film formed on a front surface thereof and a pad electrode formed on a first surface of the first insulation film;
    bonding a supporting member to the front surface of the semiconductor substrate by a resin;
    forming a via hole penetrating the semiconductor substrate from a back surface thereof to expose a second surface of the first insulation film;

forming a groove extending along a dicing line and penetrating the semiconductor substrate from the back surface of the semiconductor substrate to expose the second surface of the first insulation film;

forming a wiring layer in the via hole and the groove of the semiconductor substrate having the groove and bonded to the supporting member so that the wiring layer is disposed on the back surface of the semiconductor substrate and connected to the pad electrode through the via hole, the wiring layer being continuous from the groove to the via hole, and dicing the supporting member through the groove so as to produce a semiconductor device, wherein the via hole and the groove are formed by etching at the same time.

2. The method of claim 1, further comprising:

forming a second insulation film over the back surface of the semiconductor substrate so that the second insulation film covers inside walls of the via hole and the groove; and etching the second insulation film to remove a portion of the second insulation film at a bottom of the via hole so that inside-wall insulation films are formed on the inside walls of the via hole and the groove.

3. The method of claim 1, wherein the wiring layer is formed by plating or by sputtering.

4. The method of claim 1, further comprising forming a protection layer covering the wiring layer and forming a conductive terminal on the wiring layer.

5. A semiconductor device comprising:
a semiconductor die having a via hole;
a pad electrode disposed on a front surface of the semiconductor die so as to cover the via hole;
a supporting member bonded to the front surface of the semiconductor die;
a resin layer bonding the supporting member to the semiconductor die;
an outside sidewall comprising an etched surface of the semiconductor die and a protection layer formed on the etched surface, the outside sidewall being normal to the front surface of the semiconductor die; and
a metal layer disposed on the outside sidewall so as to be covered by the protection layer and extending into the via hole,
wherein the protection layer covers a back surface of the semiconductor die and bends so as to extend in a direction normal to the back surface to cover the etched surface of the semiconductor substrate.

6. A semiconductor device comprising:
a semiconductor die having a via hole;
a pad electrode disposed on a front surface of the semiconductor die so as to cover the via hole completely; and
an outside sidewall comprising an etched surface of the semiconductor die and a protection layer formed on the etched surface, the outside sidewall being normal to the front surface of the semiconductor die; and
a metal layer disposed on the outside sidewall so as to be covered by the protection layer and extending into the via hole,
wherein the protection layer covers a back surface of the semiconductor die and bends so as to extend in a direction normal to the back surface to cover the etched surface of the semiconductor substrate.

7. The semiconductor device of claim 6, wherein a back surface of the semiconductor die comprises an etched surface of the semiconductor die.

8. A method of manufacturing a semiconductor device, comprising:
providing a semiconductor substrate comprising a front surface and a back surface;
bonding a supporting member to the front surface of the semiconductor substrate by a resin;
etching the semiconductor substrate from the back surface to form a via hole and a groove at the same time, the groove penetrating through the semiconductor substrate and being formed along a dicing line of the semiconductor substrate, the via hole penetrating through the semiconductor substrate and being formed away from the dicing line; and
forming a wiring layer in the via hole and the groove of the semiconductor substrate having the groove and bonded to the supporting member, the wiring layer being continuous from the groove to the via hole.

9. The method of claim 8, further comprising grinding the back surface of the semiconductor device before the formation of the groove.

* * * * *